(12) United States Patent
Nussbaum

(10) Patent No.: US 6,486,683 B1
(45) Date of Patent: Nov. 26, 2002

(54) VARIABLE REACTANCE POSITION DETECTOR

(75) Inventor: Michael B. Nussbaum, Newton, MA (US)

(73) Assignee: GSI Lumonics, Inc., Watertown, MA (US)

( * ) Notice: Subject to any disclaimer, the term of this patent is extended or adjusted under 35 U.S.C. 154(b) by 0 days.

(21) Appl. No.: 09/475,960

(22) Filed: Dec. 30, 1999

(51) Int. Cl.[7] .......................... G01R 27/26; G08C 19/00
(52) U.S. Cl. ...................... 324/681; 324/668; 324/679; 340/870.37
(58) Field of Search .................. 324/658, 681, 324/663, 661, 667, 668, 686, 679; 340/870.37

(56) References Cited

U.S. PATENT DOCUMENTS

| | | | | |
|---|---|---|---|---|
| 4,864,295 A | * | 9/1989 | Rohr | 324/663 |
| 5,381,698 A | * | 1/1995 | Wiley | 73/861.77 |
| 5,392,657 A | * | 2/1995 | Feller | 340/870.3 |
| 5,537,109 A | | 7/1996 | Dowd | 340/870.37 |

* cited by examiner

Primary Examiner—N. Le
Assistant Examiner—Anjan Deb
(74) Attorney, Agent, or Firm—Cesari and McKenna, LLP

(57) ABSTRACT

A position sensor comprises a capacitive transducer and an inductor connected in series with the transducer. The transducer is a differential capacitor whose total admittance is essentially independent of changes in the sensed position. The total capacitance and inductance resonate at the fundamental frequency of a generator that provides a drive voltage and the resulting voltage across the sensor is thus substantially greater than the drive voltage. This increases the current through the transducer, and consequently increases the sensitivity of the sensor.

7 Claims, 1 Drawing Sheet

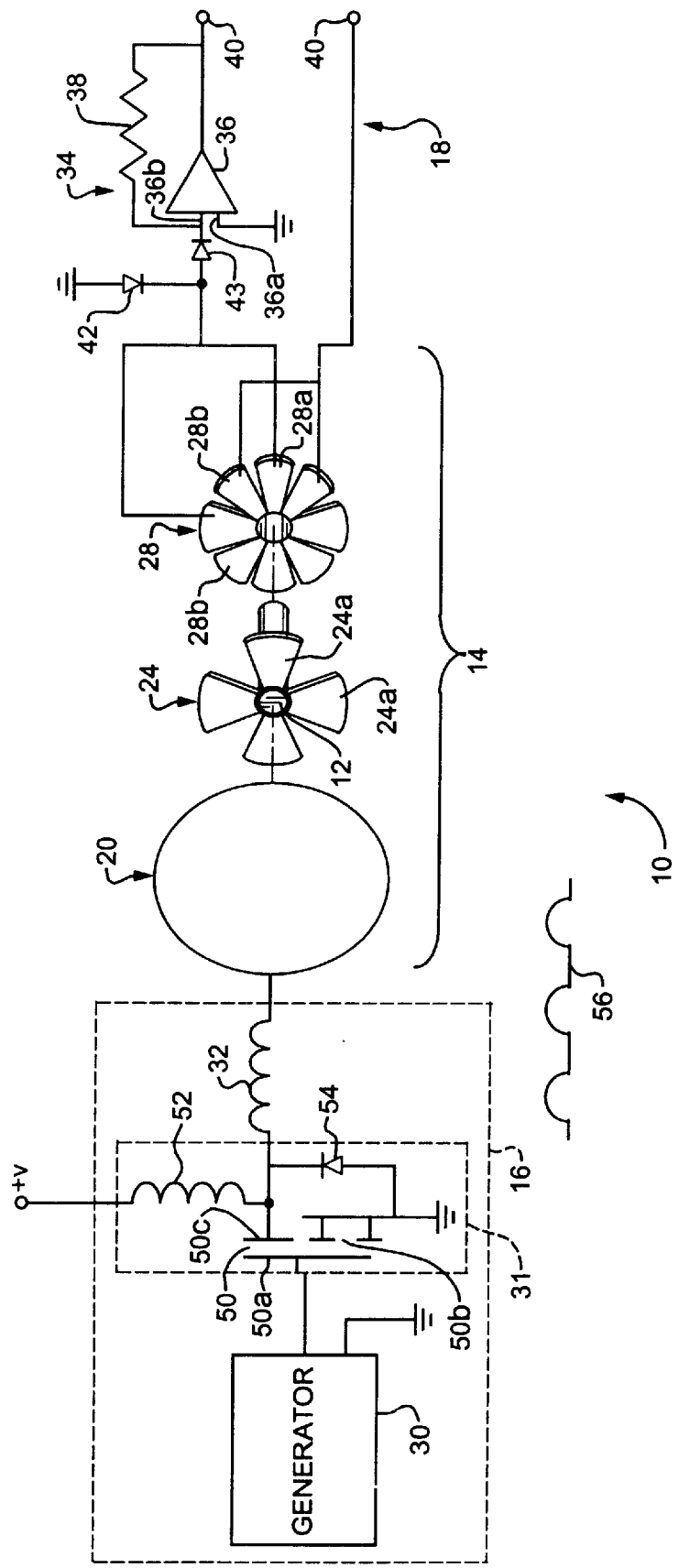

VARIABLE REACTANCE POSITION DETECTOR

BACKGROUND OF THE INVENTION

FIELD OF THE INVENTION

This invention relates to a novel position sensor in which a reactive position transducer is incorporated in a resonant circuit tuned to the drive frequency of the sensor. More particularly, it relates to a sensor driven by a square wave, in which the resonant circuit is tuned to the fundamental frequency of the square wave and thus provides a high degree of attenuation at harmonics of that frequency.

A typical application of sensors to which the invention is directed is a galvanometer unit comprising a servo-controlled, limited-rotation motor. An angular position sensor connected to a shaft of the motor provides a feedback signal for a servo loop that controls the instantaneous angular position of the shaft. The transducer is a variable reactance device, such as a compasitive transducer arranged in a differential capacitor configuration. The relative values of a pair of capacitances are linearly related to the angular position of the shaft, whereas the total capacitance is essentially independent of the shaft position.

The galvanometer units are used in devices such as optical scanners, laser cutting tools and the like and it has become increasingly desirable to reduce the sizes of these devices. In turn this has imposed a requirement that the sizes of the galvanometer units be decreased, with a resulting requirement that the position sensors be miniaturized. However, this reduces the capacitances in the sensor and the sensitivity of a capacitance transducer is roughly proportional to these capacitances. The decrease in capacitance can be offset to some extent by increasing the frequency. However, it is desirable to obtain a sensitivity that is greater than what can be obtained solely by a frequency increase. The invention is therefore directed to a reduction in the size of the sensor without a corresponding reduction in its sensitivity.

SUMMARY OF THE INVENTION

A sensor incorporating the invention includes a square-wave generator and a series-resonant circuit comprising a capacitive position transducer and an inductor. The sensor is a differential capacitor and its total capacitance is essentially independent of changes in the sensed position. The capacitance and inductance resonate at the fundamental frequency of the generator and therefore serve as a filter that removes the harmonics of that frequency. Furthermore, in a series resonant circuit the voltage across each of the reactive elements is much greater than the voltage across the circuit. Accordingly, the voltage across the capacitor is much greater than the drive voltage. This eliminates the requirement for a transformer that would otherwise be used to obtain an acceptable sensitivity when the size of the transducer is reduced.

Equivalently, the sensitivity of the sensor increases with the current through the transducer. The low impedance provided by series resonance results in a much larger current for a given drive voltage and the transducer can therefore be driven with the voltages common to integrated circuits. The circuitry can therefore be found on a semiconductor chip, which maintaining the desired sensitivity.

BRIEF DESCRIPTION OF THE DRAWING

The invention description below refers to the accompanying drawings, of which:

The drawing is a diagram of a position sensor incorporating the invention.

DETAILED DESCRIPTION OF AN ILLUSTRATIVE EMBODIMENT

As shown in the drawing, a position sensor generally indicated at 10 is employed to sense the angular position of a shaft 12 of a galvanometer motor (not shown). The sensor includes a capacitor position transducer 14, a drive circuit 16 that the transducer, and a sensing circuit responsive to the output of the transducer 13,.

The transducer 14, shown in exploded view, includes stators 20 at enclose a rotor 24 affixed to the shaft 12 for rotation therewith. The illustrated rotor is constructed of dialetric material and is configured with four radially extending lobes 24a. The stator 20 includes a drive electrode (not shown) covering the surface facing the rotor 24 and stator 22. The stator 22 includes pairs of electrode segments 28a, 28b facing the rotor 24 and stator 20. The segments 28a are connected together as are the segments 28b to provide a pair of inputs for the sensing circuit 18.

The drive circuit 16 comprises a generator 30 whose output is amplified by an amplifier 31. The output of amplifier 31 is applied between ground and the series combination of an inductor 32 and the capacitance of the transducer 14.

Preferably, in the neutral position of the shaft 12, each of the rotor lobes 24 overlies equal portions of a pair of electrode segments 28a, and 28b, so that the capacitances between the stator 20 and the segments are roughly equal. Accordingly, equal capacitive currents from the generator 30 pass through the transducer 14 to the respective input terminals of the sensing circuit 18. On the other hand, if the rotor 12 is displaced from its neutral position, the area of one of the underlying electrode segment pair opposite each of the lobes 24 increases while the underlying area of the other segment in the pair decreases. The relative capacitive currents through the electrodes in each pair change accordingly and this is reflected in the output of the sensing circuit 18.

More specifically, the sensing circuit 18 includes a pair of identical current amplifiers 34. Each of the amplifiers comprises an operational amplifier 36 whose non-inverting input terminal 36a is grounded. A feedback resister 38 is connected between an output terminal 40 and the inverting input terminal 36b of the amplifier 36. A diode 42 is connected as shown, between an output the terminal of the transducer 14 and ground. A second diode 43 is connected in series as shown.

During positive half-cycles of the ouput of the generator 30, current flows through the transducer 14 to each of the terminals 36b of the amplifiers 34, these input terminals being maintained at ground potential by virtue of feedback to the resisters 38. The voltages at the output terminals 40 thus represent the currents through the respective transducer electrode segments 28a, 28b and thus the capacitances between the stator 20 and these electrodes segments. During negative half-cycles of the generator output currents flow through the diodes 42 to ground. The difference between the voltages at the terminals 40 represents the angular position of the shaft 12.

The total transducer capacitance between the stator 20 and ground is essentially independent of the position of the shaft 12. This capacitance resonates with the reactance provided by the inductor 32 at the frequency of the output of the generator 30. The resonant combination thus has a very small impedance at that frequency and a substantial current from the generator therefore passes through the transducer. The sensitivity of the position sensor, which depends on the current through the transducer, is thus materially increased by the resonance.

Preferably, the generator 30 is a square wave (clock) generator. The resonant circuit thus provides an additional function, namely that of filtering the harmonics of the fundamental frequency of the generator output. The amplitude-frequency characteristic of the current through the transducer 14 exhibits a sharp cutoff at frequencies above the resonant frequency and thus essentially eliminates these harmonics from the transducer current.

The frequency of the generator 30 is preferably as high as is practical, e.g., 24 MHz. This contributes to the ability to maintain sensitivity of the position sensor while reducing the size of the transducer and it also permits the use of a small "air core" inductor 32 which can be included on a semiconductor chip containing the drive circuit 16 and the output circuit 18. The position sensor can thus be made small and at the same time inexpensive while maintaining the sensitivity required for highly accurate position measurements.

While a conventional amplifier 31 will provide the advantages of the inventions, we prefer to use the illustrated amplifier, which provides an additional boost to the sensitivity of the sensor 10 and aids in filtering out the harmonics of the drive frequency. Specifically, the amplifier comprises a field effect transistor (FET) 50. The output of the generator 30 is applied between the FET gate 50a and the grounded source 50b. Power is applied to the FET drain 50c through an inductor 52.

The inductor 52 resonates with the capacitance of the FET 50 to boost the voltage at the drain 50c, which is connected to the inductor 32. A diode 54 is connected as shown to provide a return path around the FET 50 for reverse current flow in the resonant circuit comprising the inductor 52 and FET 50. The voltage at the drain 50c thus has the half-sinusoid form shown at 56.

As an example of circuit values that provide the advantages of the invention, the transducer 14 may have a capacitance of approximately 10 picofarads between the stator 20 and ground. Assuming a clock frequency of 16 MHz, the inductor 32 may then have a value of 9 microhenries. With a FET 50 capacitance of 15 picofarads, the inductor 52 may have a value of 15 microhenries. These inductance valves are approximate, since stray capacitances and inductances may have a significant effect on circuit operation and thus will ordinarily be compensated by adjustment of the values and configurations of the inductors.

It will be apparent that the invention is not limited to a particular transducer construction. For example, it may be used with a concentric tubular transducer such as described in my copending U.S. Patent Application for GALVANOMETER POSITION DETECTOR, filed the same date as this application.

What is claimed is:

1. A position sensor for monitoring the position of an object, said sensor comprising:

A. a transducer comprising first and second electrically reactive sensing elements whose relative impedances vary inversely as a function of the position of the object, the sum of the the admittances of said sensing elements being essentially invariant;

B. a reactive element that resonates with the parallel combination of said sensing elements at a resonant frequency;

C. a drive circuit;
        1. providing an electrical output current at said resonant frequency, and;
        2. connected to pass the output current through the series combination of the reactive element and said parallel combination; and D. an output circuit responsive to the relative currents passing through the sensing elements.

2. The sensor defined in claim 1 in which said drive circuit includes a square wave generator, the fundamental frequency of the generator being said resonant frequency, the series combination serving to attenuate the harmonics of the resonant frequency in the current passing through said transducer.

3. The sensor defined in claim 2 in which:

A. said transducer is a capacitance transducer, the sensing elements comprising first and second capacitances; and C. said reactive element is a first inductor.

4. The sensor defined in claim 3 in which:

A. The drive circuit includes an amplifier connected to amplify the output of said generator to provide said electrical output current; and B. the amplifier includes:
        1. a field effect transistor having a gate connected to the square-wave generator and a source and drain connected to said first inductor and to a common reference point, and
        2. a second inductor connected between a power supply and the junction of said first inductor and said transistor, said second inductor resonating with the capacitance of said transistor to boost the voltage at said junction.

5. The sensor defined in claim 1 in which:

A. said transducer is a capacitance transducer, the sensing elements comprising first and second capacitances; and B. said reactive element is a first inductor.

6. The sensor of claim 5 in which said transducer comprises

A. first and second spaced apart stators, wherein
        1. said first stator comprises a common conductive surface serving as a first electrode and
        2. said second stator comprises alternating, spaced-apart second and third electrodes; and B. a rotor for mechanical connection to said object, said rotor comprising dialetric segments, each of which is disposed between said first electrode and one each of said second and third electrodes.

7. The sensor defined in claim 6 in which said output circuit is responsive to the combined currents through said second electrodes and the combined currents through said third electrodes.

* * * * *